United States Patent [19]
Blom

[11] 4,099,136
[45] Jul. 4, 1978

[54] AMPLIFIER CIRCUIT FOR HIGH FREQUENCY SIGNALS, PARTICULARLY FOR CABLE DISTRIBUTION SYSTEMS, COMPRISING AT LEAST A FIRST TRANSISTOR CONTROLLED AT ITS BASE ELECTRODE BY A SIGNAL SOURCE, AND A DIFFERENCE AMPLIFIER

[75] Inventor: Dirk Blom, Eindhoven, Netherlands

[73] Assignee: U.S. Philips Corporation, New York, N.Y.

[21] Appl. No.: 776,255

[22] Filed: Mar. 10, 1977

Related U.S. Application Data
[63] Continuation of Ser. No. 643,703, Dec. 23, 1975, abandoned.

[30] Foreign Application Priority Data
Feb. 10, 1975 [NL] Netherlands .................. 7501531

[51] Int. Cl.² .............................................. H03F 3/04
[52] U.S. Cl. ................................. 330/304; 330/69; 330/149; 330/151
[58] Field of Search ............... 330/69, 85, 149, 151, 330/295, 311

[56] References Cited
U.S. PATENT DOCUMENTS

| 3,700,832 | 10/1972 | Beurrier | 330/30 R X |
| 3,748,588 | 7/1973 | Beurrier | 330/30 R X |
| 3,918,004 | 11/1975 | Shimizu | 330/30 D |

Primary Examiner—Lawrence J. Dahl
Attorney, Agent, or Firm—Frank R. Trifari; Henry I. Steckler

[57] ABSTRACT

An amplifier circuit for high frequency signals, particularly for cable distribution systems, comprising at least a first transistor controlled at its base electrode by a signal source, and a difference amplifier in which the distortion produced across the base-emitter junction of the said transistor is eliminated in a simple manner by means of feerforward control.

6 Claims, 5 Drawing Figures

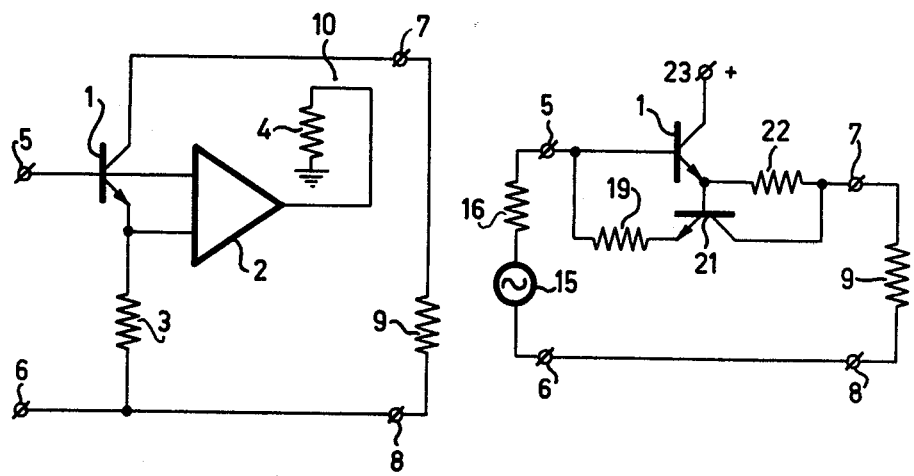
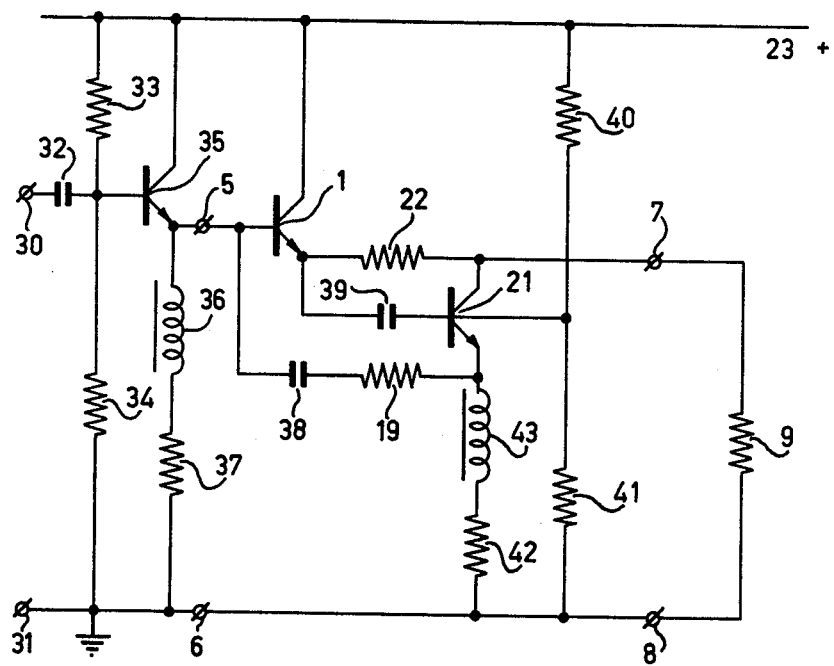
Fig.1  Fig.2
Fig.3

AMPLIFIER CIRCUIT FOR HIGH FREQUENCY SIGNALS, PARTICULARLY FOR CABLE DISTRIBUTION SYSTEMS, COMPRISING AT LEAST A FIRST TRANSISTOR CONTROLLED AT ITS BASE ELECTRODE BY A SIGNAL SOURCE, AND A DIFFERENCE AMPLIFIER

This is a continuation, division of application Ser. No. 643,703, filed Dec. 23, 1975, now abandoned.

The invention relates to an amplifier circuit for high frequency signals, particularly for cable distribution systems, comprising at least a first transistor controlled at its base electrode by a signal source, and a difference amplifier.

The distortion produced in a given amplifier stage of an amplifier circuit may be reduced by applying negative feedback over this stage. As is known feedback pre-supposes simultaneous occurrence of input and output signals. In practice the signal applied to the relevant amplifier stage will need time to pass through the stage, the so-called delay time. Correction of the input signal is thus always effected after an incorrect output signal has been produced. This lagging of the error correction has a particularly large effect when the delay time is of the same order as the period of the signal, i.e. at high signal frequencies.

A further known method of reducing the distortion produced in a given amplifier stage is to use so-called "feedforward" control as described in the article "A Feedforward Experiment Applied to an L-4 Carrier System Amplifier" by Harold Seidel, published in "I.E.E.E. Transactions of Communication Technology", Vol. com-19, no. 3, June 1971.

As compared with the aforementioned feedback control feedforward control has the advantage that parasitic oscillation is impossible because there is no closed loop. In order to measure the distortion produced in the relevant amplifier stage the input and output signals have to be available simultaneously and with the same amplitude. In the known feedforward control methods this is achieved by on the one hand attenuating the output signal and on the other hand by delaying the input signal by the same amount as the attenuated output signal. Both signals are applied to the input of a difference amplifier which produces a signal representing the distortion produced in the amplifier stage.

Particularly at high signal frequencies the distortion may be determined more accurately in this way than if feedback is used (where simultaneous occurrence of the input and output signals is impossible due to the non-compensated difference in delay between the two signals).

The distortion measured is brought to its correct amplitude in the said difference amplifier and is then added to the output signal for the purpose of correction.

The necessity in feedforward control of creating a distortion measuring point at which two signals are available both simultaneously and with the same amplitude leads to circuit arrangements which are difficult to realize in practice, particularly in amplifier circuits for a frequency range extending to very high frequencies.

The invention provides a simple amplifier circuit in which feedforward control is used without using accurate, complicated circuits and to this end it is characterized in that the base-emitter junction of a transistor controlled at its base electrode by a signal source is directly connected in parallel with the input of a difference amplifier, while the output signal from said difference amplifier is applied to the output signal from the transistor with such an amplitude and phase that the distortion therein is substantially eliminated.

The invention is based on recognition of the fact that the greatest distortion is produced in a transistor amplifier when the signal current passes the base-emitter junction of a transistor and is greater with larger signal currents.

By directly measuring the distortion where it is produced, in this case at the base-emitter junction, and, subsequent to the measurement, converting said distortion directly into a correction signal, feedforward control suitable up to very high frequencies can be realized in a very simple manner.

It should be noted that a distortion compensating circuit, fitted with tubes, is known from French Patent Specification No. 753,771. The occurrence of the distortion which is produced by a tube, can be determined by means of a voltage which is generated across a resistor, by the grid current of the tube. However, this voltage is no true representation of the character of the distortion so that also the compensation of the distortion cannot be perfect.

The similarity to the circuit according to the invention is only apparent, because, as known, it is not possible with transistors to generate, with the base current a voltage across a resistor connected into the base lead, which voltage represents the distortion voltage produced across the base-emitter barrier layer.

The invention will be described with reference to the various Figures of the drawings.

FIG. 1 shows the alternating current circuit diagram of a first embodiment of an amplifier circuit according to the invention.

FIG. 2 shows the alternating current circuit diagram of a second embodiment of an amplifier circuit according to the invention.

FIG. 3 shows an elaboration of the embodiment of FIG. 2,

Figure 4:
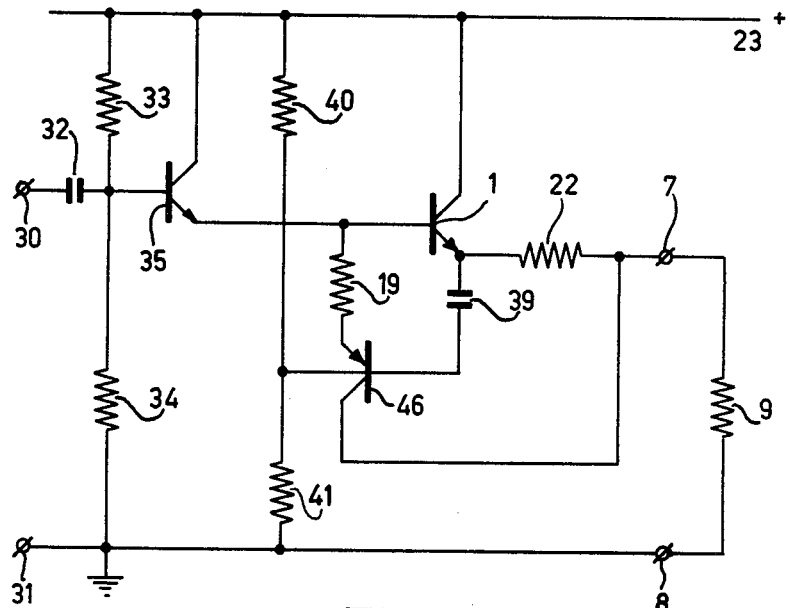
FIG. 4 shows a third embodiment of an amplifier circuit according to the invention.

FIG. 1 shows an amplifier circuit having input terminals 5 and 6 and output terminals 7 and 8. The base of a transistor 1 is connected to the input terminal 5, its collector is connected through a directional signal coupler 10 to the output terminal 7 and its emitter is connected through a resistor 3 to input terminal 6 and output terminal 8. The base and the emitter of the transistor 1 are also connected to the input of a difference amplifier 2. The output of this difference amplifier is connected to ground through the directional coupler 10 and a resistor 4. The load between the output terminals 7 and 8 is represented by a resistor 9.

The distortion occurring across the base-emitter diode of transistor 1 is directly applied to the input of the difference amplifier 2. The output signal from this difference amplifier represents the distortion in the collector-emitter current of the transistor 1. This output signal is added to the collector current of transistor 1 through the directional coupler 10 in such a manner that the distortion is eliminated. The current through the load resistor 9 is thus free from that distortion which is produced as a result of the non linear base-emitter junction characteristic of the transistor 1.

The directional coupler 10 ensures that there is no signal transmission from the output of the difference amplifier 2 to the collector of the transistor 1, and vice versa.

With a correct choice of the resistance of the resistor 4 reflection which might otherwise occur on the output lead are prevented.

FIG. 2 shows the alternating current circuit diagram of an amplifier circuit having input terminals 5 and 6 and output terminals 7 and 8. A signal source 15 having an internal resistance 16 is connected to the input terminals 5 and 6; a load resistor 9 may be connected to the output terminals 7 and 8. The input terminal 5 is connected to the base of a transistor 1 whose collector is connected to a supply terminal 23 and whose emitter is connected to the base of a transistor 21. The emitter of the transistor 21 is connected to the input terminal 5 through a resistor 19. The emitter of the transistor 1 is connected to the output terminal 7 through a terminating resistor 22. The terminating resistor 22 allows the correct termination to be obtained, which is achieved by choosing the value of this resistor to be equal to the value of the load resistor 9. The collector of the transistor 21 is also connected to the output terminal 7.

Due to the operation of the transistor 1 as an emitter follower the voltage supplied by the signal source 15 gives rise to a signal current through the collector-emitter path of this transistor, the resistor 22 and the load resistor 9. This signal current produces a distortion voltage across the base-emitter junction of the transistor 1 due to the non-linear characteristic thereof. This voltage is applied to the series arrangement of the base-emitter junction of the transistor 21 and the resistor 19. As a result a collector-emitter current which will be referred to hereinafter as the correction current, is produced in the transistor 21, which current is similar to the distortion in the emitter current of transistor 1. By choosing the resistor 19 in such a manner that its resistance is equal to the terminating resistance 22 reduced by the value of the source resistor 16, the amplitude of the correction current will be equal to the distortion current and both currents can compensate for each other.

A distortion-free current thus results at the terminal 7 and is applied to the load.

FIG. 3 shows an amplifier circuit in which corresponding components have the same reference numerals as those in FIG. 2, and which has input terminals 30 and 31 and output terminals 7 and 8. The base of a transistor 35 is connected through a coupling capacitor 32 to the terminal 30. This base is also connected to a supply lead 23 through a resistor 33 and to ground through a resistor 34.

The emitter of the transistor 35 is connected to ground through an inductor 36 and a resistor 37 while the collector of this transistor is connected to the supply lead 23. The emitter of the transistor 35 is also connected to the base of the transistor 1 through the terminal 5. The collector of transistor 1 is connected to the supply lead 23 while its emitter is connected to the output terminal 7 through the resistor 22 and to the base of the transistor 21 through a capacitor 39. This base is also connected to the supply lead 23 through a resistor 40 and to ground through a resistor 41.

The collector of the transistor 21 is connected to the terminal 7 while its emitter is connected to ground through a resistor 42 and an inductor 43 and to the base of the transistor 1 through a series arrangement of a resistor 19 and a capacitor 38.

A signal voltage applied through the coupling capacitor 32 to the base of the transistor 35 is passed on unchanged to the base of the transistor 1. The transistor 35 ensures that there is a low source impedance at the terminal 5. The d.c. bias of the transistor 35 is determined by the resistors 33 and 34 and the resistor 37. The inductor 36 ensures that the signal current in transistor 35 is sufficiently low.

The signal voltage applied to the base of the transistor 1 is converted into a corresponding signal current through the resistor 22 and the load resistor 9.

The distortion produced across the base-emitter diode of the transistor 1 is eliminated by the correction signal generated by the transistor 21 in the same manner as that described above.

As was noted in the description of FIG. 2 the value of the resistor 19 should be chosen to be equal to that of the terminating resistor 22 reduced by the source impedance at the terminal 5 so as to obtain the correct distortion compensation.

Consequently the said source impedance must be lower than the value of the termination resistor 22, which is achieved by the emitter follower action of the transistor 35.

It should be noted that the transistor 35 does not itself produce substantially any distortion because only a small signal current flows through it.

FIG. 4 shows an amplifier circuit in which components corresponding to those in FIG. 3 have the same reference numerals. The paramount difference from the amplifier circuit of FIG. 3 is that the PNP-transistor 21 is replaced by an NPN-transistor 46. If the various resistances are correctly chosen the inductors 36 and 43 occurring in the amplifier circuit of FIG. 3, the resistors 37 and 42 and the capacitor 38 may be omitted in the amplitude circuit of FIG. 4.

The manner of distortion compensation in this amplifier circuit is otherwise the same as that described for the amplifier circuit of FIG. 3.

Figure 5:
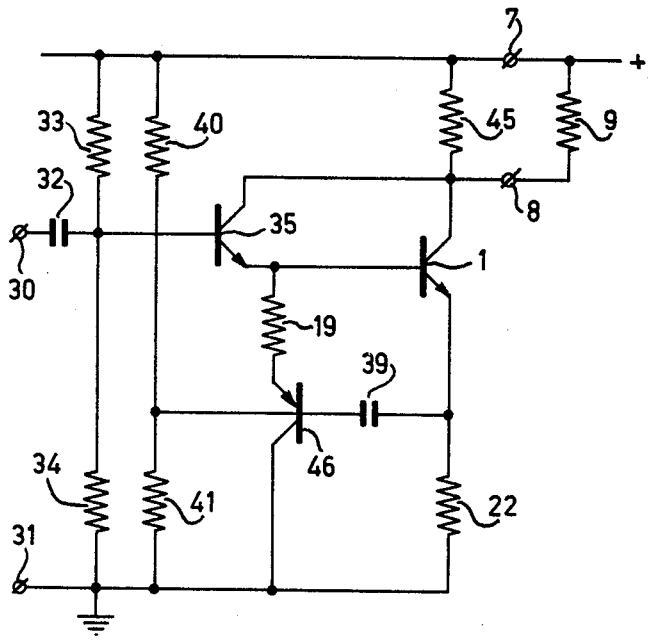
FIG. 5 shows a fourth embodiment of an amplifier circuit according to the invention.

FIG. 5 shows an amplifier circuit in which components corresponding to those in FIG. 4 have the same reference numerals. The difference from the previous amplifier circuit resides in the fact that the collectors of the transistors 35 and 1 are both connected to the output terminal 8 and to the supply lead 23 through a common collector resistor 45. This supply lead is connected to the output terminal 7. The load resistor 9 is arranged between the output terminal 7 and 8 i.e. in parallel with the collector resistor 45.

The manner of distortion compensation in this amplifier circuit is the same as that employed in the previous amplifier circuit. Thus in this case too the circuit in which distortion current circulates due to the non-linear characteristic of the base-emitter junction of the transistor 1 is constituted by the collector-emitter path of the transistor 1, the resistor 22, the collector-emitter path of the transistor 46, the emitter resistor 19 and the collector-emitter path of the transistor 35. This means that the current through the collector resistor 45 is free from distortion so that the current through the load resistor 9 arranged in parallel therewith also does not include any distortion.

What is claimed is:

1. An amplifier circuit for high frequency signals comprising at least a first transistor adapted to be controlled at its base electrode by a signal source, a difference amplifier having an input and an output, means for applying distortion generated at the base-emitter junction of said transistor to said difference amplifier and for ensuring that said difference amplifier generates substantially no distortion including means for coupling the base-emitter junction of said transistor in parallel with the input of the difference amplifier, and means for substantially eliminating distortion generated in said first transistor including means for applying the output signal from said difference amplifier to the output signal from the transistor with an amplitude and phase wherein the distortion therein is substantially eliminated.

2. An amplifier circuit as claimed in claim 1, wherein the difference amplifier includes a second transistor having a base coupled to the emitter of the first transistor and an emitter impedance coupled between the emitter of the second transistor and the base of the first transistor.

3. An amplifier circuit as claimed in claim 2, wherein the first transistor is of a conductivity type which is opposite to the conductivity type of the second transistor and that said emitter impedance comprises a galvanic connection between the emitter of the second transistor and the base of the first transistor.

4. An amplifier circuit as claimed in claim 2, wherein the emitter of the first transistor is coupled to an output electrode of the circuit through a series impedance of the same magnitude as the load impedance and that said emitter impedance has a magnitude which is substantially equal to that of said series impedance reduced by the impedance of the signal source.

5. An amplifier circuit as claimed in claim 4, wherein the signal source includes a third transistor controlled at its base electrode, and having a emitter coupled to the base electrode of the first transistor.

6. An amplifier circuit as claimed in claim 2, wherein the signal source includes a third transistor controlled at its base electrode, and having a emitter coupled to the base electrode of the first transistor, the collectors of the first and third transistors being coupled together and to the load impedance.

* * * * *